(12) United States Patent
Georgiadis (10) Patent No.: US 11,588,499 B2
(45) Date of Patent: Feb. 21, 2023

(54) LOSSLESS COMPRESSION OF NEURAL NETWORK WEIGHTS

(71) Applicant: Samsung Electronics Co., Ltd., Suwon-si (KR)

(72) Inventor: Georgios Georgiadis, Porter Ranch, CA (US)

(73) Assignee: SAMSUNG ELECTRONICS CO., LTD.

( * ) Notice: Subject to any disclaimer, the term of this patent is extended or adjusted under 35 U.S.C. 154(b) by 727 days.

(21) Appl. No.: 16/223,105

(22) Filed: Dec. 17, 2018

(65) Prior Publication Data

US 2020/0143249 A1    May 7, 2020

Related U.S. Application Data

(60) Provisional application No. 62/756,071, filed on Nov. 5, 2018.

(51) Int. Cl.
*H03M 7/34* (2006.01)
*H03M 7/40* (2006.01)
*G06N 3/10* (2006.01)

(52) U.S. Cl.
CPC ............... *H03M 7/40* (2013.01); *G06N 3/10* (2013.01)

(58) Field of Classification Search
CPC . G06T 1/20; G06T 2207/10024; G06T 5/005; H03M 7/30; H03M 7/3059;
(Continued)

(56) References Cited

U.S. PATENT DOCUMENTS 6,987,468 B1 *   1/2006   Malvar ................... H03M 7/00
                                                              341/59
7,447,814 B1 *  11/2008   Ekman ................ G06F 12/0897
                                                             711/170
(Continued)

FOREIGN PATENT DOCUMENTS

CN     106529670 A     3/2017
CN     107086910 A     8/2017

OTHER PUBLICATIONS

Sneyers, Jon et al., "FLIF: Free Lossless Image Format Based on Maniac Compression," 2016 IEEE, pp. 66-70.
(Continued)

*Primary Examiner* — Linh V Nguyen
(74) *Attorney, Agent, or Firm* — Renaissance IP Law Group LLP (57) ABSTRACT

A system and a method provide compression and decompression of weights of a layer of a neural network. For compression, the values of the weights are pruned and the weights of a layer are configured as a tensor having a tensor size of H×W×C in which H represents a height of the tensor, W represents a width of the tensor, and C represents a number of channels of the tensor. The tensor is formatted into at least one block of values. Each block is encoded independently from other blocks of the tensor using at least one lossless compression mode. For decoding, each block is decoded independently from other blocks using at least one decompression mode corresponding to the at least one compression mode used to compress the block; and deformatted into a tensor having the size of H×W×C.

17 Claims, 6 Drawing Sheets

(58) Field of Classification Search
CPC .... H03M 7/3062; H03M 7/40; H03M 7/3082; H03M 7/55; G06F 16/1744; G06F 16/283; G06F 17/16; G06F 17/18; G06F 17/30153; G06F 17/30592
USPC .............................. 341/51, 60, 87, 106, 107
See application file for complete search history.

(56) References Cited

U.S. PATENT DOCUMENTS

| | | | | |
|---|---|---|---|---|
| 2014/0133552 | A1* | 5/2014 | Beer-Gingold | H04N 19/13 375/240.03 |
| 2014/0167987 | A1* | 6/2014 | Pell | H03M 7/30 341/59 |
| 2016/0092702 | A1* | 3/2016 | Durham | G06F 9/35 713/190 |
| 2018/0046897 | A1 | 2/2018 | Kang et al. | |
| 2018/0046900 | A1 | 2/2018 | Dally et al. | |
| 2018/0082181 | A1 | 3/2018 | Brothers et al. | |
| 2019/0251418 | A1* | 8/2019 | Nakanishi | G06T 9/002 |
| 2020/0104692 | A1* | 4/2020 | Hill | G06F 5/06 |
| 2020/0105025 | A1* | 4/2020 | Yea | H04N 19/147 |
| 2020/0167654 | A1* | 5/2020 | Guo | G06N 3/063 |
| 2020/0242811 | A1* | 7/2020 | Wang | G06T 9/001 |
| 2020/0285892 | A1* | 9/2020 | Baum | G06F 9/3001 |
| 2020/0285950 | A1* | 9/2020 | Baum | G06F 8/41 |
| 2020/0304802 | A1* | 9/2020 | Habi | G06N 3/0472 |
| 2020/0304808 | A1* | 9/2020 | He | H04N 19/56 |
| 2021/0105494 | A1* | 4/2021 | Sugio | H04N 19/46 |
| 2021/0125070 | A1* | 4/2021 | Wang | G06F 17/16 |
| 2021/0192357 | A1* | 6/2021 | Sinha | G06N 3/0454 |

OTHER PUBLICATIONS

Wikipedia, "Exponential-Golomb coding," (https://en.wikipedia.org/wiki/Exponential-Golomb_coding), retrieved Jul. 6, 2020, 2 pages.
Wikipedia, "Golomb coding," (https://en.wikipedia.org/wiki/Golomb_coding), retrieved Jul. 6, 2020, 7 pages.
Marpe, Detlev et al., "Context-Based Adaptive Binary Arithmetic Coding in the H.264/AVC Video Compression Standard", IEEE Transactions On Circuits And Systems For Video Technology, vol. X, No. Y, (2003), 18 pages.

* cited by examiner

LOSSLESS COMPRESSION OF NEURAL NETWORK WEIGHTS

CROSS-REFERENCE TO RELATED APPLICATION

This patent application claims the priority benefit under 35 U.S.C. § 119(e) of U.S. Provisional Patent Application No. 62/756,071, filed on Nov. 5, 2018, the disclosure of which is incorporated herein by reference in its entirety.

TECHNICAL FIELD

The subject matter disclosed herein generally relates to a system and a method that provides lossless encoding/decoding of weights of a neural network to reduce memory requirements and accelerate execution of neural networks.

BACKGROUND

Deep neural networks have recently been dominating a wide range of applications ranging from computer vision (image classification, image segmentation), natural language processing (word-level prediction, speech recognition, and machine translation) to medical imaging, and so on. Dedicated hardware has been designed to run the deep neural networks as efficiently as possible. On the software side, however, some research has focused on minimizing memory and computational requirements of these networks during runtime.

When attempting to train neural networks on embedded devices having limited memory, it is important to minimize the memory requirements of the algorithm as much as possible. During training a majority of the memory is actually occupied by the activation maps. For example, activation maps of current deep neural network systems consume between approximately 60% and 85% of the total memory required for the system. The weights of a convolutional neural network, which typically belong to either a convolutional layer or to a fully connected layer, similarly occupy a significant part of the memory. Consequently, reducing the memory footprint associated with activation maps and with the weights becomes a significant part of reducing the entire memory footprint of a training algorithm.

SUMMARY

An example embodiment provides a system to compress weights of a layer of a neural network in which the system may include: a processor programmed to initiate executable operations including: configuring, using the processor, the weights of a layer as a tensor having a tensor size of H×W×C in which H represents a height of the tensor, W represents a width of the tensor, and C represents a number of channels of the tensor; formatting the tensor into at least one block of values; and encoding the at least one block independently from other blocks of the tensor using at least one lossless compression mode. In one embodiment, the at least one lossless compression mode is selected from a group including Exponential-Golomb encoding, Sparse-Exponential-Golomb encoding, Sparse-Exponential-Golomb-RemoveMin encoding, Golomb-Rice encoding, Exponent-Mantissa encoding, Zero-encoding, Fixed length encoding, and Sparse fixed length encoding. In another embodiment, the at least one lossless compression mode selected to encode the at least one block may be different from a lossless compression mode selected to encode another block of the tensor, and the at least one block may be encoded independently from other blocks of the tensor using a plurality of the lossless compression modes.

Another example embodiment provides a method to compress weights of a neural network in which the method may include: configuring, using a processor, the weights of a layer as a tensor having a tensor size of H×W×C in which H represents a height of the tensor, W represents a width of the tensor, and C represents a number of channels of the tensor; formatting the tensor into at least one block of values; and encoding the at least one block independently from other blocks of the tensor using at least one lossless compression mode. In one embodiment, the method may further include selecting the at least one lossless compression mode from a group including Exponential-Golomb encoding, Sparse-Exponential-Golomb encoding, Sparse-Exponential-Golomb-RemoveMin encoding, Golomb-Rice encoding, Exponent-Mantissa encoding, Zero-encoding, Fixed length encoding, and Sparse fixed length encoding. In another embodiment, the at least one lossless compression mode selected to encode the at least one block may be different from a lossless compression mode selected to compress another block of the tensor, and encoding the at least one block may further include encoding the at least one block independently from other blocks of the tensor using a plurality of the lossless compression modes.

Still another example embodiment provides a method to decompress encoded weights of a neural network in which the method may include: decompressing, using a processor, an encoded block of values of a bitstream representing values of weights to form at least one decompressed block of values, the decompressed block of values being independently decompressed from other blocks of the weights using at least one decompression mode corresponding to at least one lossless compression mode used to compress the at least one block; and deformatting the decompressed block to be part of a tensor having a size of H×W×C in which H represents a height of the tensor, W represents a width of the tensor, and C represents a number of channels of the tensor, the tensor being the decompressed weights. In one embodiment, the at least one lossless compression mode may be selected from a group including Exponential-Golomb encoding, Sparse-Exponential-Golomb encoding, Sparse-Exponential-Golomb-RemoveMin encoding, Golomb-Rice encoding, Exponent-Mantissa encoding, Zero-encoding, Fixed length encoding, and Sparse fixed length encoding. In another embodiment, the method may further include: configuring, using the processor, the weights as a tensor having a tensor size of H×W×C in which H represents a height of the tensor, W represents a width of the tensor, and C represents a number of channels of the tensor; formatting the tensor into at least one block of values; and encoding the at least one block independently from other blocks of the tensor using at least one lossless compression mode in which the at least one lossless compression mode selected to compress the at least one block may be different from a lossless compression mode selected to compress another block of the tensor, and compressing the at least one block may further include compressing the at least one block independently from other blocks of the tensor using a plurality of the lossless compression modes.

BRIEF DESCRIPTION OF THE DRAWINGS

In the following section, the aspects of the subject matter disclosed herein will be described with reference to exemplary embodiments illustrated in the figures, in which.

DETAILED DESCRIPTION

In the following detailed description, numerous specific details are set forth in order to provide a thorough understanding of the disclosure. It will be understood, however, by those skilled in the art that the disclosed aspects may be practiced without these specific details. In other instances, well-known methods, procedures, components and circuits have not been described in detail not to obscure the subject matter disclosed herein.

Reference throughout this specification to "one embodiment" or "an embodiment" means that a particular feature, structure, or characteristic described in connection with the embodiment may be included in at least one embodiment disclosed herein. Thus, the appearances of the phrases "in one embodiment" or "in an embodiment" or "according to one embodiment" (or other phrases having similar import) in various places throughout this specification may not be necessarily all referring to the same embodiment. Furthermore, the particular features, structures or characteristics may be combined in any suitable manner in one or more embodiments. In this regard, as used herein, the word "exemplary" means "serving as an example, instance, or illustration." Any embodiment described herein as "exemplary" is not to be construed as necessarily preferred or advantageous over other embodiments. Also, depending on the context of discussion herein, a singular term may include the corresponding plural forms and a plural term may include the corresponding singular form. It is further noted that various figures (including component diagrams) shown and discussed herein are for illustrative purpose only, and are not drawn to scale. Similarly, various waveforms and timing diagrams are shown for illustrative purpose only. For example, the dimensions of some of the elements may be exaggerated relative to other elements for clarity. Further, if considered appropriate, reference numerals have been repeated among the figures to indicate corresponding and/or analogous elements.

The terminology used herein is for the purpose of describing particular exemplary embodiments only and is not intended to be limiting of the claimed subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement the teachings of particular embodiments disclosed herein.

Unless otherwise defined, all terms (including technical and scientific terms) used herein have the same meaning as commonly understood by one of ordinary skill in the art to which this subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The subject matter disclosed herein relates to a system and a method that provides a lossless compression of weights of a neural network to reduce memory requirements and accelerate execution of neural networks. The weights of a convolutional neural network typically belong to either a convolutional layer or a fully connected layer, and both types of layers will be referred to herein as a layer. In one embodiment, three general stages provide a lossy compression pipeline for compressing the weights: a pruning stage, a quantization stage, and an entropy coding stage. In the pruning, the weights of a neural network may be pruned to reduce the number of weights of a layer. In the quantization stage, the pruned weights are quantized. In the entropy coding stage, the pruned and quantized weights are divided into smaller units, referred to herein as compress blocks, that are compressed using a variety of different compression modes. In one embodiment, the compress blocks are compressed to generate a bit stream representing the compressed weights of a convolutional layer or a fully connected layer. The compress units may be decompressed, dequantized and reformatted into the original shape of the pruned weights. The techniques disclosed herein may be performed using hardware having a relatively low complexity.

The encoding and decoding may be performed on the weights for each layer of the neural network independently from weights of other layers, and as needed by the training algorithm. While the lossless encoding/decoding technique disclosed herein may compress all degrees of sparsity of the weights (including 0% and nearly 100% sparsity), the technique disclosed herein may be optimized if the number of zero values in the weights of a layer is relatively high. That is, the system and method disclosed herein achieves a higher degree of compression for a corresponding higher degree of sparsity. Additionally, the subject matter disclosed herein provides several modifications to existing compression algorithms that may be used to leverage the sparsity of the values of the weights of a layer for a greater degree of compression.

In one embodiment, an encoder that may be configured to receive as an input a tensor of size H×W×C in which H corresponds to the height of the input tensor, W to the width of the input tensor, and C to the number of channels of the input tensor. The received tensor may be formatted into smaller blocks that are referred to herein as "compress units." Compress units may be independently compressed using a variety of different compression modes. The output generated by the encoder is a bitstream of compressed compress units. When a compress unit is decompressed, it is reformatted into its original shape as at least part of a tensor of size H×W×C.

The techniques disclosed herein may be applied to reduce memory requirements for weights of neural networks that are configured to provide applications such as, but not limited to, computer vision (image classification, image segmentation), natural language processing (word-level prediction, speech recognition, and machine translation) and medical imaging. The neural network applications may be used within autonomous vehicles, mobile devices, robots, and/or other low-power devices (such as drones). The techniques disclosed herein reduce memory consumption by a neural network during training and/or as embedded in a dedicated device. The techniques disclosed herein may be implemented on a general-purpose processing device or in a dedicated device.

Figure 1:
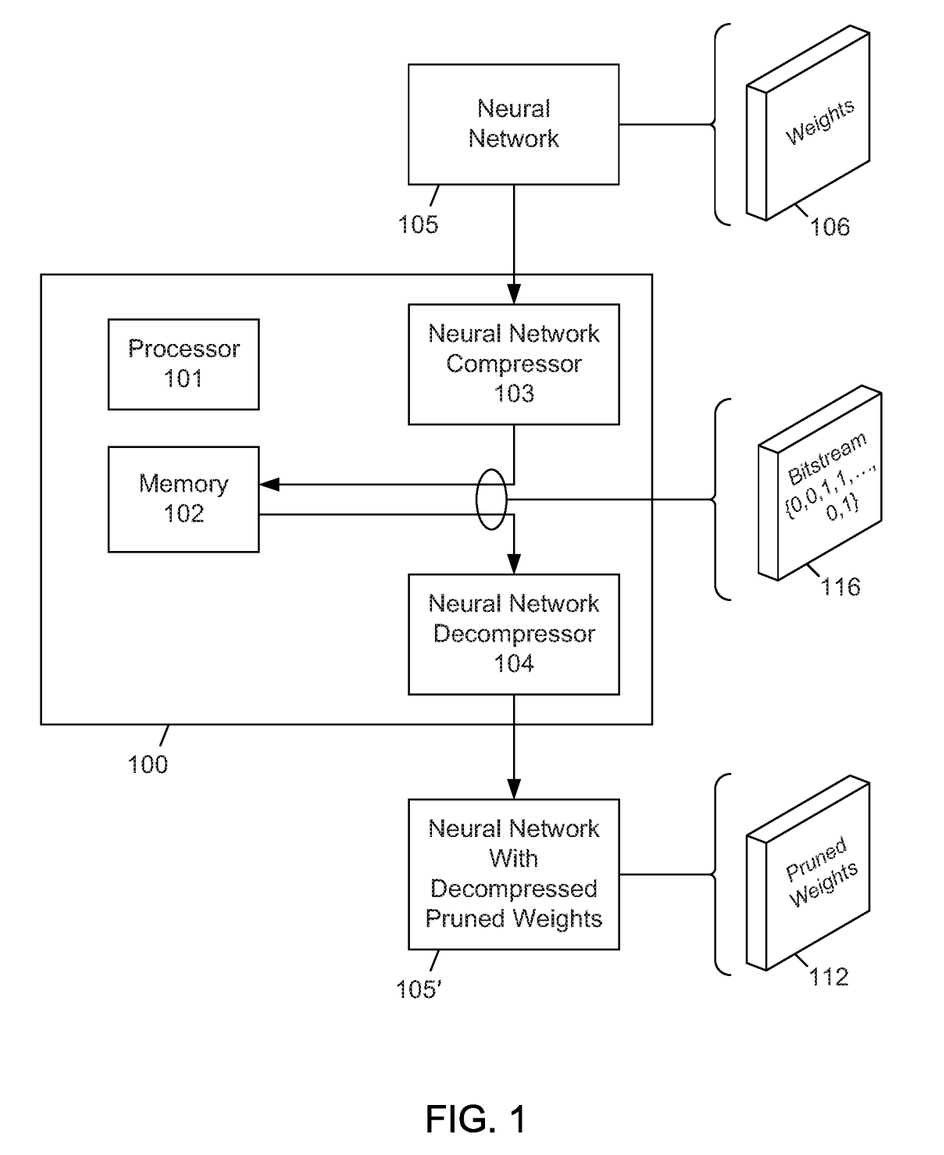
FIG. 1 depicts a functional block diagram of an example embodiment of a system for lossless compression and decompression of weights of a neural network according to the subject matter disclosed herein.

FIG. 1 depicts a functional block diagram of an example embodiment of a system 100 for lossless compression and decompression of weights of a neural network according to the subject matter disclosed herein. The system 100 includes a processor 101, memory 102, a compressor 103 and a decompressor 104. During training and/or during inference, the compressor 103 and the decompressor 104 respectively compresses weights 106 of a neural network 105 to form a bitstream 116 and decompresses the bitstream 116 to reform the weights. Prior to compressing the weights of a layer, the compressor 103 and the decompressor 104 are configured to use corresponding compression and decompression modes. The system 100 may also include one or more additional processors (not shown), bulk storage (not shown) and input/output devices, such as, but not limited to, a keyboard (not shown), a display (not shown) and a pointing device (not shown).

The compressor 103 and the decompressor 104 may be embodied as modules. The term "module," as used herein, refers to any combination of software, firmware and/or hardware configured to provide the functionality described herein in connection with a module. The software may be embodied as a software package, code and/or instruction set or instructions, and the term "hardware," as used in any implementation described herein, may include, for example, singly or in any combination, hardwired circuitry, programmable circuitry, state machine circuitry, and/or firmware that stores instructions executed by programmable circuitry. The modules may, collectively or individually, be embodied as circuitry that forms part of a larger system, for example, but not limited to, an integrated circuit (IC), system on-chip (SoC) and so forth. Additionally, the processor 101 and the memory 102 may be components of a module forming the compressor 103 and/or the decompressor 104. Alternatively, the processor 101 and the memory 102 may be utilized by modules forming the compressor 103 and/or the decompressor 104.

Figure 1A:
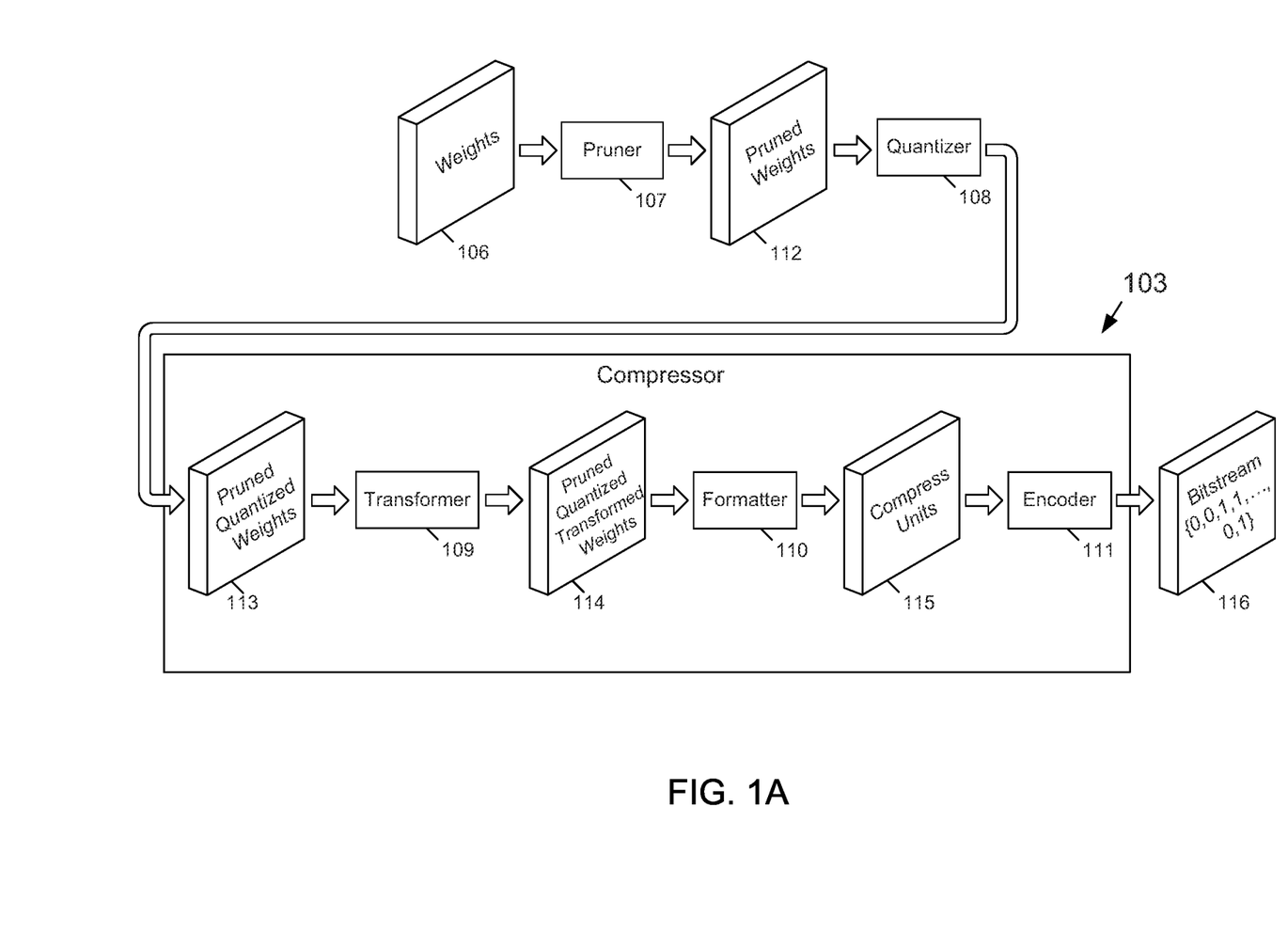
FIG. 1A depicts a functional block diagram of a compressor according to the subject matter disclosed herein.

FIG. 1A depicts a functional block diagram of the compressor 103 according to the subject matter disclosed herein. The compressor 103 may include a pruner 107, a quantizer 108, a transformer 109, a formatter 110 and a lossless encoder 111. While the pruner 107 and the quantizer 108 are depicted in FIG. 1A as being separate from the compressor 103, in other embodiments, the pruner 107 and/or the quantizer 108 may be part of the compressor 103.

The weights 106 of a layer of the neural network 105 may be configured, for example, by the processor 101 and the memory 102, to be a tensor of a predetermined size. In one embodiment, the weights 106 may be configured to a tensor of size H×W×C in which H corresponds to the height of the input tensor, W to the width of the input tensor, and C to the number of channels of the input tensor. The weights 106 of a layer may be formed and stored as a single tensor of size H×W×C.

The weights 106 of a layer of the neural network 105 may be pruned by the pruner 107 to form pruned weights 112 so that the lossless compression performed by the encoder 111 will be more effective. In one embodiment, the following example pruning technique may be used. A percentage p of weights values that are to be pruned may be specified that sets a threshold against which absolute values of the weights are compared. Weights having an absolute value that is less than the threshold are set to 0. The threshold may increase or decrease depending on the percentage p selected. In other embodiments, an alternative pruning technique may be used. Depending on the pruning technique used, however, the compressibility of the resulting tensors may be affected.

The pruned weights 112 may be quantized by a quantizer 108 to form pruned and quantized weights 113. In another embodiment, a uniform quantization technique may be used that includes two regions: a positive and a negative region in which the respective positive and the negative values may have their own min/max normalization. Alternatively, a uniform quantization technique may be used over the entire domain of weight values, which may result in a sub-optimal solution as code values around 0 may remain unused because pruning may have eliminated weight values around 0. One way to alleviate such a problem may be to shift all non-zero values to range between −1 and 1. If uniform quantization is used over the entire domain [−inf, +inf] of the weights without separating into positive and negative regions, an extra step may be necessary: The quantized values around 0 remain unused ([−k, . . . −2, −1, 1, 2, . . . , k] for some small k), so all values may be offset by −k(positive)/k(negative). This may be necessary because the compression modes considered herein always assign smaller code words for small values. If this is not done, a large number of bits may be unnecessarily wasted. It should be understood, however, that any quantizing technique may be used and depending on the technique used, the compressibility of the resulting tensors may be affected.

The pruned and quantized weights 113 are input to the transformer 109, which maps the values to a more compressible space by occupying a small subset of the domain of the weights, to form pruned, quantized and (optionally) transformed weights 114. For example, in 8-bits, it is often the case that only about 128 code values are used from an available 256 values. Thus, it may be beneficial to apply a transform that results in using only the smallest code values to save additional bits during encoding. An example transform may be that a zero value is mapped to zero, arbitrary k positive values are mapped to values 1, . . . , k, and arbitrary l negative values are mapped to values −1, . . . , −l. For example, the values −10, −6, −5, −1, 0, 2, 4, 5 are respectively mapped to −4, −3, −2, −1, 0, 1, 2, 3. An entropy coder will on average use a relatively a fewer number of bits to compress the mapped values.

It is necessary to store the inverse mapping in order to reverse the mapping action during decoding. Additionally, it should be noted that the transformer 109 is optional and may be skipped if computational efficiency is an issue.

To facilitate compression, the H×W×C pruned, quantized and (optionally) transformed weights 114 may be formatted by the formatter 110 into blocks of values, in which each block is referred to herein as "compress units" 115. That is, a pruned, quantized and (optionally) transformed weights 114 of tensor size H×W×C may be divided into smaller compress units 115. The compress units 115 may include K elements (or values) in a channel-major order in which K>0; a scanline (i.e., each block may be a row of weights); or K elements (or values) in a row-major order in which K>0. Other techniques or approaches for forming compress units 115 are also possible. For example, a loading pattern of weights maps for the corresponding neural-network hardware may be used as a basis for a block (or compress unit) formatting technique.

Each compress unit 115 may be losslessly encoded, or compressed, independently from other compress units by an encoder 111 to form a bitstream 116. The bit stream 116 may be stored in the memory 102 or in a memory associated with the neural network 105. Each compress unit 115 may be losslessly encoded, or compressed, using any of a number of compression techniques, referred to herein as "compression modes" or simply "modes." Each compress unit may be encoded using use a different mode. To choose a compression mode, all available modes are run and the mode that generates the smallest bitstream is selected. To reduce complexity, two other options may be considered. First, a single mode (e.g., Sparse-Exponential-Golomb) may be used. Alternatively, two modes may be used of which one is a fixed length compression mode (e.g., Sparse-Exponential-Golomb compression mode and the fixed length compression mode). If encoder fails to compress the compress unit, then the fixed length mode is used as a default mode. The fixed length mode essentially allows quantized weights to pass-through.

Example lossless compression modes include, but are not limited to, Exponential-Golomb encoding, Sparse-Exponential-Golomb encoding, Sparse-Exponential-Golomb-RemoveMin encoding, Golomb-Rice encoding, Exponent-Mantissa encoding, Zero-encoding, Fixed length encoding and Sparse fixed length encoding. It should be understood that other lossless encoding techniques may be used either in addition or as an alternative one of the example compression modes. It should also be noted that many of the example compression modes are publically available or based on publically available compression modes, except, however, the Sparse-Exponential-Golomb and the Sparse-Exponential-Golomb-RemoveMin compression modes. Details for the Sparse-Exponential-Golomb and the Sparse-Exponential-Golomb-RemoveMin compression modes are provided herein.

The Exponential-Golomb encoding is a well-known compression mode that assigns variable length codes in which smaller numbers are assigned shorter codes. The number of bits used to encode numbers increases exponentially, and one parameter, commonly referred to as the order k parameter, controls the rate at which the number of bits increases. The pseudocode below provides example details of the Exponential-Golomb compression mode.

```
Let x, x >= 0 be the input, let k be the parameter (order)
Generate output bitstream: <Quotient Code><Remainder Code>:
Quotient Code:
    Encode q = floor (x / 2^k) using 0-order exp-Golomb code:
    z = binary (q + 1)
    numBits = len (z)
    Write numBits-1 zero bits followed by z, and denote by u
Remainder Code:
    Encode r = x % 2^k in binary, and denote by f = binary (r)
Concatenate u,f to produce output bitstream
```

An example of the Exponential-Golomb compression mode is:
x=23, k=3
q=floor (23/2^3)=2
z=binary (2+1)=binary (3)=11
numBits=len (z)=2
u=011 (2−1=1 zeros followed by z)
f=binary (r)=binary (23% 8)=binary (7)=111
Final output=011+111=011111

Table 1 sets forth values of the Exponential-Golomb compression mode for input values x=0-29 and for order k=0-3.

| x | k = 0 | k = 1 | k = 2 | k = 3 |
|---|---|---|---|---|
| 0 | 1 | 10 | 100 | 1000 |
| 1 | 010 | 11 | 101 | 1001 |
| 2 | 011 | 0100 | 110 | 1010 |
| 3 | 00100 | 0101 | 111 | 1011 |
| 4 | 00101 | 0110 | 01000 | 1100 |
| 5 | 00110 | 0111 | 01001 | 1101 |
| 6 | 00111 | 001000 | 01010 | 1110 |
| 7 | 0001000 | 001001 | 010110 | 1111 |
| 8 | 0001001 | 001010 | 01100 | 010000 |
| 9 | 0001010 | 001011 | 01101 | 010001 |
| 10 | 0001011 | 001100 | 01110 | 010010 |
| 11 | 0001100 | 001101 | 01111 | 010011 |
| 12 | 0001101 | 001110 | 0010000 | 010100 |
| 13 | 0001110 | 001111 | 0010001 | 010101 |
| 14 | 0001111 | 00010000 | 0010010 | 010110 |
| 15 | 000010000 | 00010001 | 0010011 | 010111 |
| 16 | 000010001 | 00010010 | 0010100 | 011000 |
| 17 | 000010010 | 00010011 | 0010101 | 011001 |
| 18 | 000010011 | 00010100 | 0010110 | 011010 |
| 19 | 000010100 | 00010101 | 0010111 | 011011 |
| 20 | 000010101 | 00010110 | 0011000 | 011100 |
| 21 | 000010110 | 00010111 | 0011001 | 011101 |
| 22 | 000010111 | 00011000 | 0011010 | 011110 |
| 23 | 000011000 | 00011001 | 0011011 | 011111 |
| 24 | 000011001 | 00011010 | 0011100 | 00100000 |
| 25 | 000011010 | 00011011 | 0011101 | 00100001 |
| 26 | 000011011 | 00011100 | 0011110 | 00100010 |
| 27 | 000011100 | 00011101 | 0011111 | 00100011 |
| 28 | 000011101 | 00011110 | 000100000 | 00100100 |
| 29 | 000011110 | 00011111 | 000100001 | 00100101 |

The Sparse-Exponential-Golomb compression mode is an extension, or variation, of Exponential-Golomb compression mode in which if the value x that is to be encoded is a 0, the value x is represented by a "1" in the output bitstream. Otherwise, Exponential-Golomb encoding adds a "0" and then encodes the value x−1 using standard Exponential-Golomb. In one embodiment in which block (compress unit) values are eight bits, an order k=4 may provide the best results.

The Sparse-Exponential-Golomb-RemoveMin compression mode is an extension, or variation, to the Sparse-Exponential-Golomb compression mode that uses the following rules: (1) Before values are encoded in a compress unit, the minimum non-zero value is determined, which may be denoted by the variable y. (2) The variable y is then encoded using Exponential-Golomb compression mode. (3) If the value x that is to be encoded is a 0, then it is encoded as a "1," and (4) otherwise a "0" is added to the bitstream and then x–y is encoded using the Exponential-Golomb compression mode.

The Golomb-Rice compression mode and the Exponent-Mantissa compression mode are well-known compression algorithms. The pseudocode below sets forth example details of the Golomb-Rice compression mode.

```
Let x, x >= 0 be the input and M be the parameter. M is a power of 2.
q = floor (x / M)
r = x % M
Generate output bitstream: <Quotient Code><Remainder Code>:
        Quotient Code:
                Write q-length string of 1 bits
                Write a 0 bit
        Remainder Code: binary (r) in log₂ (M) bits
```

An example of the Golomb-Rice compression mode is:
x=23, M=8, log₂ (M)=3
q=floor (23/8)=2
r=7
Quotient Code: 110
Remainder Code: 111
Output=110111

The Zero-encoding compression mode checks whether the compress unit is formed entirely of zeros and, if so, an empty bitstream is returned. It should be noted that the Zero-compression mode cannot be used if a compress unit contains at least one non-zero value.

The Fixed length encoding compression mode is a baseline, or default, compression mode that performs no compression, and simply encodes the values of a compress unit using a fixed number of bits.

Lastly, the sparse fixed length encoding compression mode is the same as Fixed length encoding compression mode, except if a value x that is to be encoded is a 0, then it is encoded as a 1, otherwise, a 0 is added and a fixed number of bits are used to encode the non-zero value.

Exponential-Golomb and Sparse-Exponential-Golomb compression modes work only with non-negative numbers. To use the Sparse-Exponential-Golomb compression mode with both positive and negative numbers, the following example mapping may be used.

```
def sparse_exp_golomb_encode ( x , k ):
    bitstream = ""
    if x == 0:
                bitstream += "1"
        elif x > 0 :
                x = 2 * x - 1
                bitstream += "0"
                bitstream += exp_golomb.encode ( x , k )
        elif x < 0:
                x = 2 * np.abs ( x ) - 2
                bitstream += "0"
                bitstream += exp_golomb.encode ( x , k )
        return bitstream
```

Figure 2:
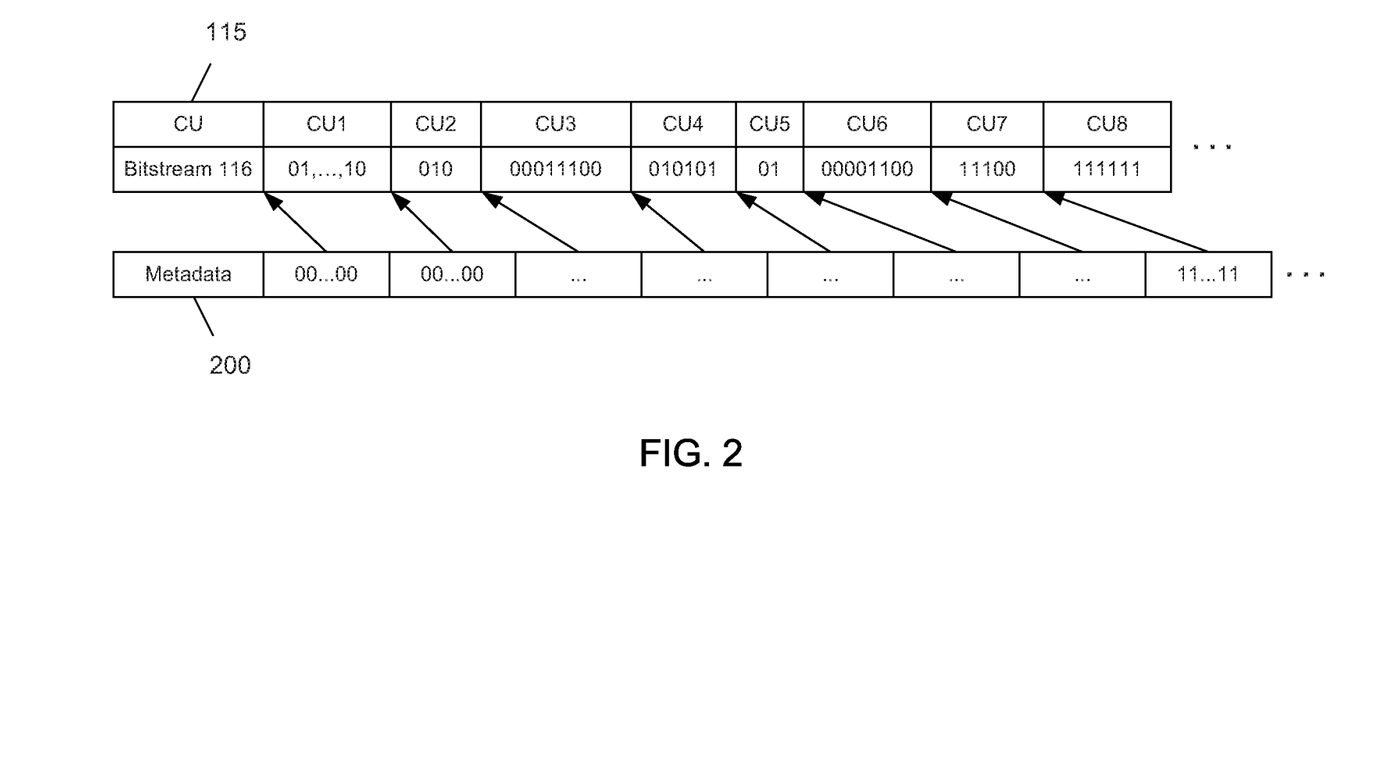
FIG. 2 depicts an example relationship between encoded compress units in a bitstream and a metadata structure indicating where an encoded compress unit 115 begins according to the subject matter disclosed herein.

Metadata may be used for random access to the compress units 115. If metadata is used, the encoder 111 outputs a bitstream, such as bitstream 116, and a metadata structure. FIG. 2 depicts an example relationship between encoded compress units 115 in a bitstream 116 and a metadata structure 200 indicating where an encoded compress unit 115 begins according to the subject matter disclosed herein. The metadata structure 200 includes the memory address of where an encoded compress unit starts in the bitstream 116. For the relationship depicted in FIG. 2, the address in memory of a compress unit 115 is represented in 32 bits.

Referring back to FIG. 1A, in one embodiment, the encoder 111 may start the compressed bitstream 116 with 48 bits in which 16 bits may be used respectively denote H, W and C of the input tensor. Each compress unit 115 may be compressed iteratively for each compression mode that may be available. The compression modes available for each compress unit may be fixed during compression of the weights of a layer. In one embodiment, the full range of available compression modes may be represented by L bits. If, for example, four compression modes are available, a two bit prefix may be used to indicate corresponding indices (i.e., 00, 01, 10 and 11) for the four available compression modes. In an alternative embodiment, a prefix variable length coding technique may be used to save some bits. For example, the index of the compression mode most commonly used by the encoder 111 may be represented by a "0", and the second, third and fourth most commonly used compression mode respectively represented by a "10," "110" and "111." If only one compression mode is used, then appending an index to the beginning of a bitstream 116 for a compress unit would be unnecessary.

In one embodiment, when a compress unit 115 is compressed, all available compression modes may be run and the compression mode that has generated the shortest bitstream may be selected. The corresponding index for the selected compression mode may be appended as a prefix to the beginning of the bitstream for the particular compress unit and then the resulting bitstream for the compress unit may be added to the bitstream for weights of an entire layer. The process may then be repeated for all compress units for the weights of the layer. Each respective compress unit of the weights of a layer may be compressed using a compression mode that is different from the compression mode used for an adjacent, or neighboring, compress unit. In one embodiment, a small number of compression modes, such as two compression modes, may be available to reduce the complexity of compressing the weights.

Figure 1B:
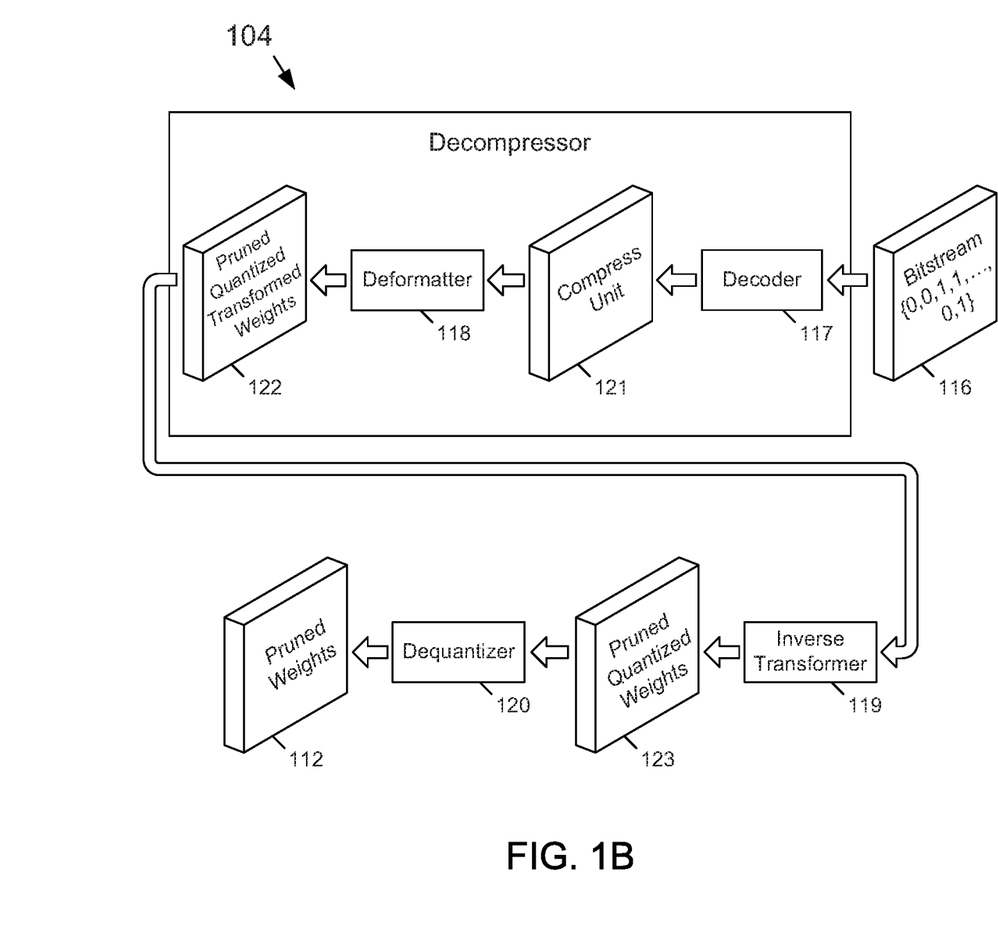
FIG. 1B depicts a functional block diagram of a decompressor according to the subject matter disclosed herein.

FIG. 1B depicts a functional block diagram of the decompressor 104 according to the subject matter disclosed herein. The decompressor 104 decompresses a bitstream 116 to form the pruned weights 112 for a neural network 105', which are lossless decompressions corresponding to the pruned weights 112 (FIG. 1A). Thus, the neural network 105' may be a modified version of the original (unpruned) neural network 105 having unpruned weights.

The decompressor 104 may include a decoder 117, a deformatter 118, an inverse transformer 119, and a dequantizer 120. While the inverse transformer 119 and the dequantizer 120 are depicted in FIG. 1B as being separate from the decompressor 104, in other embodiments, the inverse transformer 119 and/or the dequantizer 120 may be part of the decompressor 104.

In one embodiment, the decompressor 104 reads the first 48 bits to retrieve H, W and C, and processes the bitstream 116 one compress unit at a time. The decompressor 104 has knowledge of both the number of bits for the index of the mode and of the number of elements in a compress unit (either W or K depending on the compression mode used). That is, the bitstream 116 corresponding to the pruned and quantized weights 113 is decompressed by the decoder 117 to form a compress unit 121.

For example, if the decoder 117 is decoding a compress unit in the bitstream 116 that has been encoded using the Sparse-Exponential-Golomb compression mode, the following example pseudocode may be used. It should be noted that a metadata structure has been generated that is associated with the bitstream 116.

```
Decoding exp-Golomb (exp_golomb.decode):
    If k == 0:
        Let n be the count of consecutive zeros
        n = n+1 (add 1 to the count)
        curpos = n-1
        Read n subsequent bits binval = bitstream [ curpos : curpos + n ]
        x = int ( binval ,2 ) //cast to integer
        x = x - 1
        Reverse mapping of x to positive/negative
    if k > 0:
        Let x_q = decode Quotient part using decoder for 0-order exp_Golomb //also
returns curpos in bitstream
        Let binvalx_r = bitstream [ curpos : curpos + k ]
        Let binvalx_r = bitstream [ curpos : curpos + k ]
        x_r = int (binvalx_r, 2)
        x = x_q * 2^k + x_r
        Reverse mapping of x to positive/negative
Decoding sparse-exp-Golomb:
//curpos indicates current location in bitstream
if bitstream [ curpos ] == "1":
    x = 0
        curpos +=1
    else:
```

```
        curpos +=1
        x , curpos = exp_golomb.decode ( bitstream , k , curpos )
    return x, curpos
```

The compress unit 121 is deformatted by a deformatter 118 to form pruned, quantized and transformed weights 122 having a tensor of size H×W×C.

If a transformation was used in the encoding process, the mapping provided by that transformation is reversed by the inverse transformer 119. The following example pseudocode provides a reverse mapping from positive to positive and negative values.

```
    if x % 2 == 0:
                            x= -( x + 2 ) / 2
            else:
                            x= (x + 1) / 2
```

The inverse transformer 119 outputs the pruned and quantized weights 122, which is dequantized by the dequantizer 120 to form the pruned weights 112.

Figure 3A:
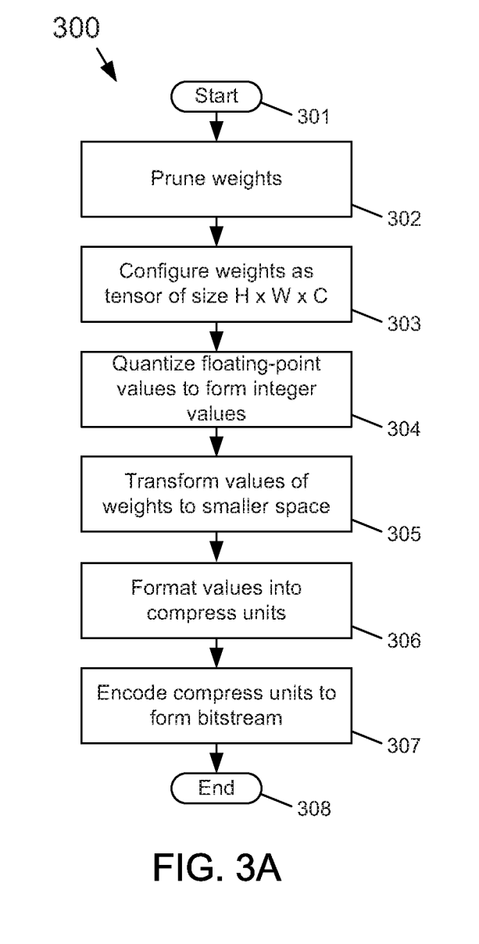
FIGS. 3A and 3B respectively depict example embodiments of an encoding method and a decoding method of weights of a deep neural network according to the subject matter disclosed herein.
Figure 3B:
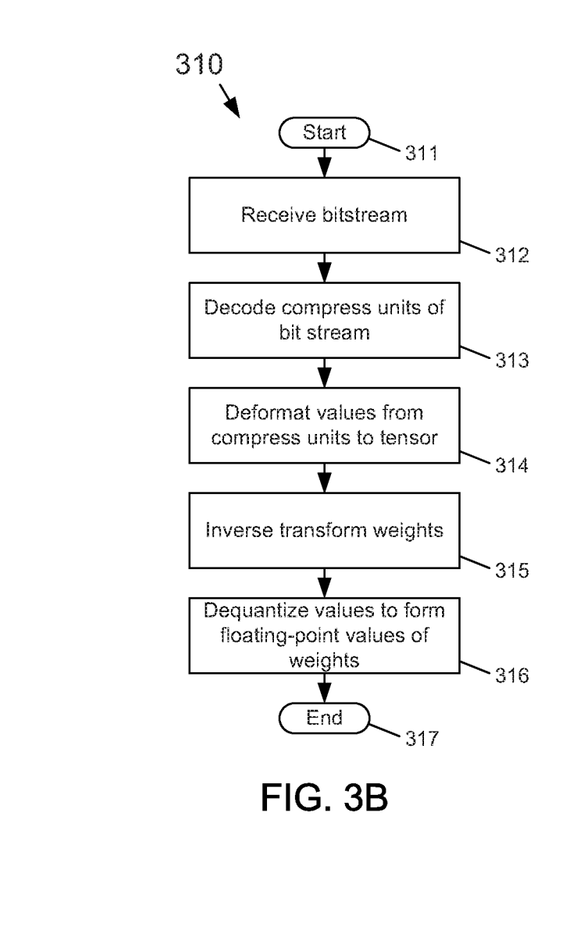

FIGS. 3A and 3B respectively depict example embodiments of an encoding method 300 and a decoding method 310 of weights of a deep neural network according to the subject matter disclosed herein. The weights of each layer of the neural network may be processed by the encoding/decoding method pair of FIGS. 3A and 3B. Prior to compressing the weights, the compressor 103 and the decompressor 104, such as respectively depicted in FIGS. 1A and 1B, are configured to use corresponding compression and decompression modes.

In FIG. 3A, the process starts at 301. At 302, the weights of a neural network are pruned to have an increased number of values that are equal to zero so that the lossless compression performed later will be more effective. That is, while pruning may be optional, it should be understood that pruning would be desirable so that the compression of the weights is more effective.

At 303, the pruned weights are configured to be encoded. The weights that has been generated at a layer of a neural network is configured to be a tensor of size H×W×C in which H corresponds to the height of the input tensor, W to the width of the input tensor, and C to the number of channels of the input tensor. If the values of the pruned weights have not been quantized from floating-point numbers to be integers, then at 304 the non-quantized values of the pruned weights may be quantized into integer values having any bit width to form pruned and quantized weights.

At 305, the pruned and quantized weight may be optionally transformed to map the values of the weight to a more compressible space by occupying a small subset of the domain of the weights.

At 306, the weights may be formatted into compress units. At 307, each compress unit may be losslessly encoded, or compressed, independently from other compress units to form a bitstream. Each compress unit may be losslessly encoded, or compressed, using any of a number of compression modes. Example lossless compression modes include, but are not limited to, Exponential-Golomb encoding, Sparse-Exponential-Golomb encoding, Sparse-Exponential-Golomb-RemoveMin encoding, Golomb-Rice encoding, Exponent-Mantissa encoding, Zero-encoding, Fixed length encoding and Sparse fixed length encoding. Each compress unit is compressed iteratively for each compression mode that may be available. In one embodiment, when a compress unit is compressed, all available compression modes may be run and the compression mode that has generated the shortest bitstream may be selected. When all compress units for the weights of a layer have been encoded, the process ends for the weights at 308. The process 300 of FIG. 3A continues in the same manner for the weights of each layer of the neural network.

In FIG. 3B, the process begins at 311. At 312, a bitstream is received and the first 48 bits are read to retrieve an encoded compress unit. At 313, each encoded compress unit is decoded to form a decoded compress unit. At 314, each decoded compress unit is deformatted to form pruned, quantized and transformed weights. At 315, the weights are inverse transformed to map the values of the weight back to a larger space. At 316, the values are dequantized to form pruned weights corresponding to the pruned weights of the neural network prior to compression. The process ends for the weights at 317. The process 310 of FIG. 3B continues in the same manner to decompress the weight of each layer of the neural network.

The following example pseudocode corresponds to the method 300.

```
#Tensor T has size HxWxC
def compress (T):
    bitstream = ""
    for each channel, c, in C
        CU = formatWeights(c)
        for each cu in CU
            bitstream + = compressCU(cu)
    return bitstream
def compressCU(cu)
    bitstreams = generateBitstreamsforAllComprModes(cu)
    minBitstreamIdx, minBitstream = shortestBitstream(bitstreams)
    mode = binary(minBitstreammIdx)
    bitstream = mode + minBitstream
    return bitstream
}
```

The following example pseudocode corresponds to the method 310.

```
def decompress(bitstream):
    H,W,C=getWeightShape(bitstream[0:48])
    bitstream=bitstream[48:]
    CU=[ ]
    while bitstream 1=" ":
        cu, bitstream=decompressCU(bitstream)
        CU.append(cu)
    return deformatCU (CU, H, W, C)
#decompressUnit already knows how many compression
modes are used and how many bits are used as header to
indicate index of compression mode. In one embodiment,
the number of compression modes used is the number L.
#decompressUnit also knows how many elements are con-
tained in a compress unit, in this example the number of
elements is K.
#decodeNextValue(bitstream, modeIdx) uses the modeIdx
to choose the correct decoder to decode the next value. It
also strips the bits used from bitstream. It returns the
decoded value and the stripped bitstream.
    def decompressCU (bitstream):
        modeIdx=getComprModeIndex(bitstream[0:L])
        bitstream=bitstream[L:]
        cu=[ ]
        for k in range (K):
            val, bitstream=decodeNextValue (bitstream, mod-
                eIdx)
            cu.append (val)
        return cu, bitstream
```

Figure 4:
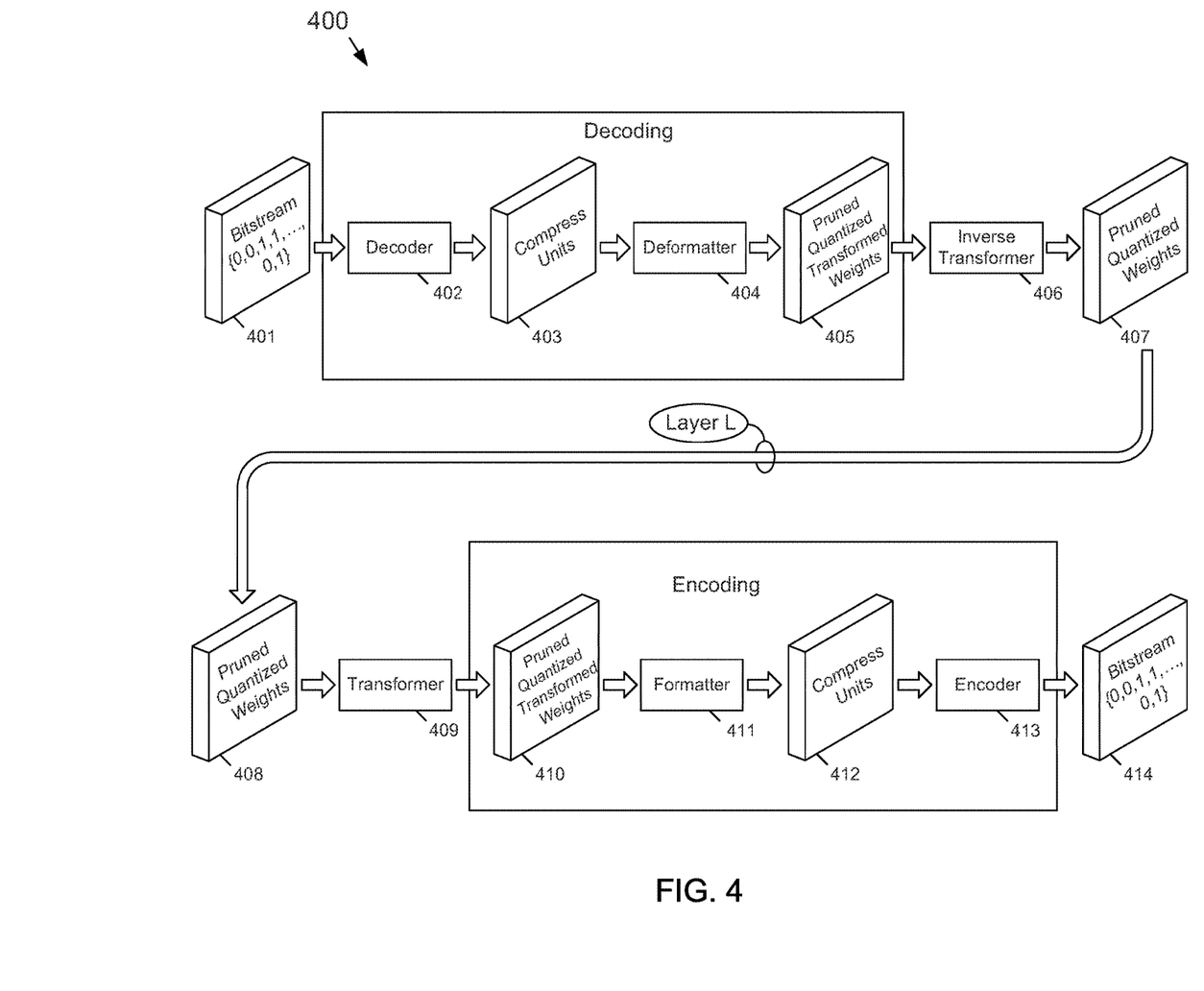
FIG. 4 depicts an operational flow of weights at a layer L of a neural network according to the subject matter disclosed herein.

FIG. 4 depicts an operational flow 400 of weights at a layer L of a neural network according to the subject matter disclosed herein. The operational flow 400 represents both forward and backward processing directions through the layer L. That is, the operational flow 400300 represents an operational flow for training a neural network and for forming an inference from an input to the neural network. Encoded representation of weights of the original weights of a neural network is turned into a bitstream 401 as it is read out of a memory, such as memory 102 in FIG. 1. At 402, the bitstream is decoded to form compress units 403. The compress units 403 are deformatted at 404 to form pruned, quantized and transformed weights 405. At 406, the weights are inverse-transformed to form pruned quantized weights 407 for use at the layer L. It should again be noted that quantizing and/or transforming the weights may be optional.

After use at the layer L, the weights 408 are transformed at 409 to form pruned, quantized and transformed weights 410. The weights are formatted at 411 to form compress units 412. The compress units 412 are encoded at 413 to form a bitstream 414, which is stored a memory, such as, memory 102 in FIG. 1.

As will be recognized by those skilled in the art, the innovative concepts described herein can be modified and varied over a wide range of applications. Accordingly, the scope of claimed subject matter should not be limited to any of the specific exemplary teachings discussed above, but is instead defined by the following claims.

What is claimed is:

1. A system to compress weights of a layer of a neural network, the system comprising:
   a processor programmed to initiate executable operations comprising:
      configuring, using the processor, the weights of a layer as a tensor having a tensor size of H×W×C in which H represents a height of the tensor, W represents a width of the tensor, and C represents a number of channels of the tensor;
      formatting the tensor into at least one block of values; and
      encoding the at least one block independently from other blocks of the tensor using Sparse-Exponential-Golomb-RemoveMin lossless compression encoding.

2. The system of claim 1,
   wherein the at least one block is encoded independently from other blocks of the tensor using the lossless compression mode.

3. The system of claim 1, wherein the processor is further programmed to initiate executable operations comprising pruning the weights to form pruned weights before configuring the weights as a tensor.

4. The system of claim 1, wherein the processor is further programmed to initiate executable operations comprising quantizing values of the weights to form quantized weights before configuring the weights as a tensor.

5. The system of claim 1, wherein the processor is further programmed to initiate executable operations comprising transforming values of the weights to a smaller domain before configuring the weights as a tensor.

6. The system of claim 1, wherein encoding the at least one block further comprises generating a metadata structure indicating an address in memory of each encoded block.

7. The system of claim 1, wherein the executable operations further comprise outputting the at least one block encoded as a bit stream.

8. The system of claim 7, wherein executable operations further comprise:
   decoding the at least one block independently from other blocks of the tensor using a decompression mode corresponding to the compression mode used to compress the at least one block; and
   deformatting the at least one block into a tensor having the size of H×W×C.

9. A method to compress weights of a neural network, the method comprising:
   configuring, using a processor, the weights of a layer as a tensor having a tensor size of H×W×C in which H represents a height of the tensor, W represents a width of the tensor, and C represents a number of channels of the tensor;
   formatting the tensor into at least one block of values; and
   encoding the at least one block independently from other blocks of the tensor using Sparse-Exponential-Golomb-RemoveMin lossless compression encoding.

10. The method of claim 9,
wherein encoding the at least one block further comprises encoding the at least one block independently from other blocks of the tensor using the lossless compression mode.

11. The method of claim 9, further comprising pruning the weights to form pruned weights before configuring the weights as a tensor.

12. The method of claim 9, further comprising quantizing values of the weights to form quantized weights before configuring the weights as a tensor.

13. The method of claim 9, wherein encoding the at least one block further comprises generating a metadata structure indicating an address in memory of each encoded block.

14. The method of claim 9, further comprising outputting the at least one block encoded as a bit stream.

15. The method of claim 14, further comprising:
decompressing, using the processor, the at least one block independently from other blocks of the tensor using a decompression mode corresponding to the compression mode used to compress the at least one block; and
deformatting the at least one block into a tensor have the size of H×W×C.

16. A method to decompress encoded weights of a neural network, the method comprising:
decompressing, using a processor, an encoded block of values of a bitstream representing values of weights to form at least one decompressed block of values, the decompressed block of values being independently decompressed from other blocks of the weights using Sparse-Exponential-Golomb-RemoveMin lossless compression encoding; and
deformatting the decompressed block to be part of a tensor having a size of H×W×C in which H represents a height of the tensor, W represents a width of the tensor, and C represents a number of channels of the tensor, the tensor being the decompressed weights.

17. The method of claim 16, further comprising:
configuring, using the processor, the weights as a tensor having a tensor size of H×W×C in which H represents a height of the tensor, W represents a width of the tensor, and C represents a number of channels of the tensor;
formatting the tensor into at least one block of values; and
encoding the at least one block independently from other blocks of the tensor using the lossless compression mode,
wherein compressing the at least one block further comprises compressing the at least one block independently from other blocks of the tensor using the lossless compression mode.

* * * * *